(12) United States Patent
Khurana et al.

(10) Patent No.: US 10,528,689 B1
(45) Date of Patent: Jan. 7, 2020

(54) VERIFICATION PROCESS FOR IJTAG BASED TEST PATTERN MIGRATION

(71) Applicant: Cadence Design Systems, Inc., San Jose, CA (US)

(72) Inventors: Rajesh Khurana, Noida (IN); Vivek Chickermane, Slaterville Springs, NY (US); Dhruv Dua, Noida (IN); Krishna Vijaya Chakravadhanula, Vestal, NY (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 467 days.

(21) Appl. No.: 15/364,049

(22) Filed: Nov. 29, 2016

(51) Int. Cl.
*G06F 17/50* (2006.01)

(52) U.S. Cl.
CPC ........ *G06F 17/504* (2013.01); *G06F 17/5036* (2013.01)

(58) Field of Classification Search
USPC ........................................................ 716/106
See application file for complete search history.

(56) References Cited

U.S. PATENT DOCUMENTS

| 2011/0083195 A1* | 4/2011 | Crouch | .......... | G01R 31/318558 726/27 |
| 2012/0137186 A1* | 5/2012 | Portolan | ........ | G01R 31/318533 714/727 |

* cited by examiner

*Primary Examiner* — Eric D Lee
(74) *Attorney, Agent, or Firm* — Tarolli, Sundheim, Covell & Tummino LLP

(57) ABSTRACT

A system and methods to verify a correctness of data formatted according to an IEEE P1687 (IJTAG) standard, in connection with migration of test patterns from an instrument level to a top level of an integrated circuit design. Data describing an integrated circuit at the instrument level and at the top level is read from Instrument Connectivity Language (ICL) files, Procedural Description Language (PDL) files, and hardware description language (HDL) files. The methods include at least one of verifying structural descriptions of the integrated circuit in the ICL files and verifying an ability to use chip level inputs to access instruments in the integrated circuit. The verification procedure is performed prior to a simulation in which a migrated test pattern is applied to the integrated circuit.

20 Claims, 9 Drawing Sheets

VERIFICATION PROCESS FOR IJTAG BASED TEST PATTERN MIGRATION

FIELD OF THE INVENTION

The present invention relates to verification of integrated circuits, in particular to a system and methods for verification of data formatted according to the IEEE P1687 (IJTAG) standard.

BACKGROUND

The IEEE 1149.1 Joint Test Action Group (JTAG) standard sets forth a protocol for using a test-access port (TAP) controller to perform various tests, such as boundary scan tests, and to interface with circuits that perform built-in self-tests. JTAG has been widely used to test printed circuit boards, integrated circuits and other circuits that include circuit modules often referred to as embedded "instruments". JTAG tests are typically created in-house by instrument manufacturers or designers.

Modern integrated circuits tend to combine instruments from many different sources onto the same die for packaging as a chip. A chip designer must be familiar with the operation of the individual instruments in order to connect them together properly. Further, the chip designer should be able to test the individual instruments, which are not normally accessible at the top (e.g., chip) level of the completed design. The IJTAG standard addresses this concern by providing a standard protocol in which the JTAG TAP controller is used to interface with instruments. IJTAG provides an Instrument Connectivity Language (ICL) by which a designer can specify how circuit blocks are interconnected, including the interconnections between instruments in a chip. In contrast to hardware description language (HDL) definitions, ICL definitions are not detailed descriptions of the instrument's structure and behavior, but are instead abstract, hierarchical definitions of signals, registers, and input or output (I/O) ports needed to operate the instrument. ICL definitions include information necessary for performing read, write or scan operations on the instrument.

IJTAG also provides a Procedural Description Language (PDL) by which a designer defines the syntax and semantics of read, write or scan operations with respect to a circuit device's I/O ports. ICL and PDL definitions may be specified at the instrument level. PDL definitions may include test commands that apply test patterns to the instruments. Integrating the instrument level PDL definitions into a chip design generally requires using a software based, electronic design automation (EDA) tool to "retarget" the instrument level PDL definitions by translating operations specified in PDL to the top level, using hierarchical descriptions defined in ICL as a reference. This retargeting process is sometimes referred to as migration and is not limited to PDL definitions; migration can also refer to the overall process of translating instrument level data to top level data, to produce data that can be input to a simulator for simulating the chip. Thus, the migration of test patterns may include, in addition to PDL operations, the translation of boundary scan instructions or other instrument-specific test data not specified in ICL or PDL.

FIG. 1 is a block diagram of a chip model 100 that illustrates the relationships between the ICL and PDL definitions throughout the chip hierarchy. The model 100 includes instruments 120A to 120N, which collectively form a module 110 within the chip. For simplicity, only one module is shown. Additionally, instruments need not be grouped together, but instead may be stand-alone within the chip. The instruments include respective ICL definitions 122A to 122N and respective PDL definitions 124A to 124N. These instrument level definitions are generally supplied by an instrument manufacturer for use by the chip designer. A chip designer or other entity that integrates these instruments into the module 110 can also specify ICL definitions 112 and PDL definitions 114 for the module. A migration tool would need to translate the instrument level PDL definitions 124 to the module level PDL definitions 114 and, ultimately, to a chip level PDL definition 104. The translation process will reference the ICL definitions 102, 112 and 122 so that instrument operations, including test commands, can be converted to corresponding operations whose input parameters include I/O ports or registers at the chip level.

Errors in the ICL or PDL definitions can affect the validity of test pattern migration. These errors manifest themselves during simulation of the chip, when the application of migrated test patterns (such as retargeted PDL commands) produces discrepancies in the outputs of the chip. Mismatches between actual output values and expected output values can be due to several reasons including errors in test patterns and structural errors (for example, an error in an ICL definition that results in an attempt to access an instrument via a pin that does not, in fact, control the instrument). The chip designer then has the burden of debugging the errors, which can be difficult and time consuming. Accordingly, there is a need for ways to check the correctness of data relied upon for test pattern migration. Such a check should be performed as early as possible, preferably before simulation so that the designer can take appropriate corrective action. In this way, the designer can be confident that the migrated test patterns are being correctly applied to the instruments, in manners intended by the instrument manufacturers, to produce test results that correctly reflect the designed behaviors of the instruments.

DETAILED DESCRIPTION

The following description of embodiments provides non-limiting representative examples referencing numerals to particularly describe features and teachings of different aspects of the invention. The embodiments described should be recognized as capable of implementation separately or in combination with each other. A person of ordinary skill in the art reviewing the description of embodiments should be able to learn and understand the different described aspects of the invention. The description of embodiments should facilitate understanding of the invention to such an extent that other implementations, not specifically covered but within the knowledge of a person of skill in the art having read the description of embodiments, would be understood to be consistent with an application of the invention.

Embodiments of the present invention relate to verification checks performed early in the flow of a migration process, resulting in quicker design turnaround times and reducing a need for debugging. Verification methods will be described which operate on design information at various levels of a design hierarchy (e.g., ICL and PDL definitions, as well as HDL definitions). Reference is made to a chip design, however the described embodiments are readily applicable to any integrated circuit (IC) design that combines multiple instruments, including ICs that are not packaged as chips.

Figure 1:
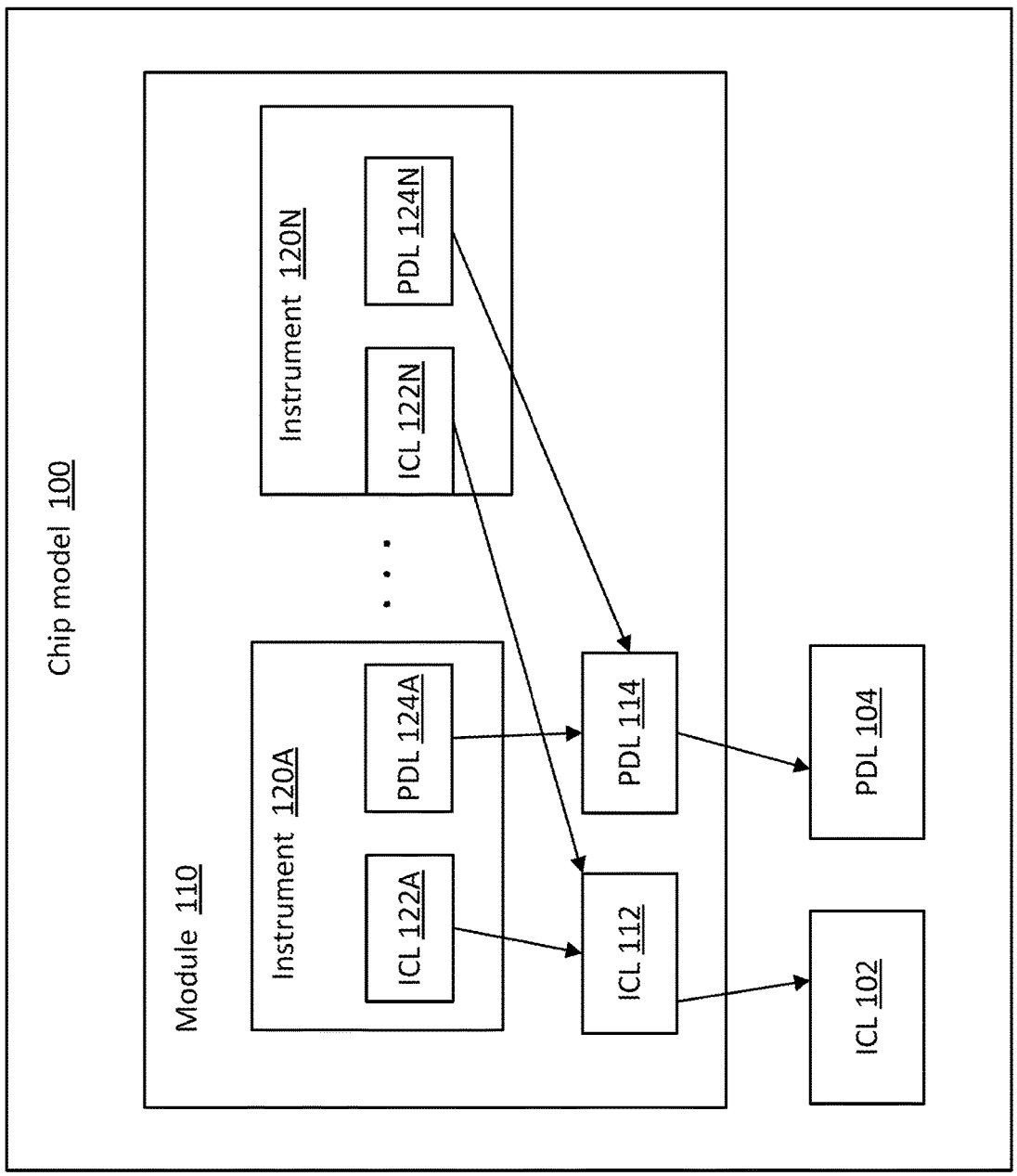
FIG. 1 is a block diagram of a circuit model.
Figure 2:
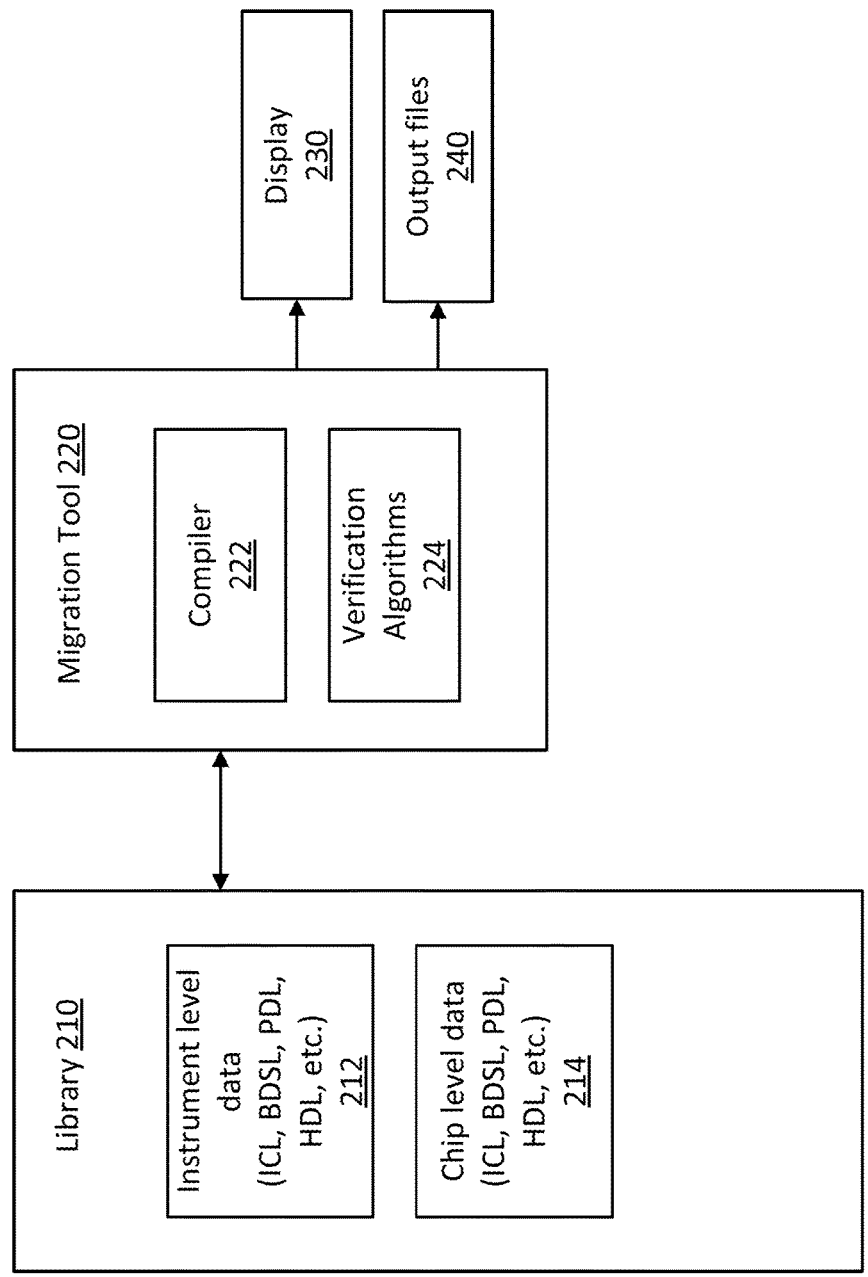
FIG. 2 is a block diagram of a verification system.

FIG. 2 is a block diagram of a verification system 200 according to an embodiment of the present invention. The system 200 may reside on one or more computer devices, each comprising a hardware processor, a hardware storage medium, and software or hardware interfaces for communicating with each other or with a human user (e.g., the chip designer).

The system 200 includes a library 210, a migration tool 220, a display 230 and a set of output files 240. The library 210 contains instrument level data 212 and chip level data 214. The library 210 may include additional data for other hierarchy levels. For simplicity, this additional data has been omitted from the drawings. The data 212 and 214 may each include, but are not limited to, ICL, PDL, HDL and boundary scan description language (BDSL) files. The instrument level data 212 may be supplied by different instrument manufacturers. The chip level data 214 are supplied by the chip designer and reflect the overall design of the chip after the various instruments have been integrated into the design.

The migration tool 220 may be implemented as a software program and performs the above noted retargeting of PDL definitions from lower levels of the hierarchy to the top level, in this case the chip level. The migration tool 220 may be part of an overall design suite comprising software programs that facilitate the testing and development of circuits. Such a suite may include, for example, a circuit simulator that applies migrated test patterns to simulate the operation of the chip design based on the behaviors provided in the HDL definitions. As will be explained, in some instances, a verification algorithm can make use of the simulator to apply basic inputs (e.g., logic level 1's and 0's) without performing a comprehensive simulation, e.g., a simulation using migrated test patterns. The migration tool 220 may include a compiler module 222 that produces a description of the structure and interconnections in the entire chip based on the HDL definitions. This description can be in the form of a netlist or a representation of the netlist, such as a flat or hierarchical model. The migration tool 220 may include one or more verification algorithms 224, examples of which are described below. The verification algorithms are executed prior to simulation, in order to detect errors in the ICL or PDL definitions early in the migration process, in particular before migrated test patterns are simulated to determine their correctness. In fact, the verifications can be performed even before the test patterns are migrated, as in the method of FIG. 4 described below.

The system 200 may include a display device 230, such as a computer monitor, to display results of the verification algorithms. The results can also be stored for subsequent retrieval in the output files 240, which may include a log file in a machine readable format such as a binary file, or a human readable format such as a text document.

Figure 3:
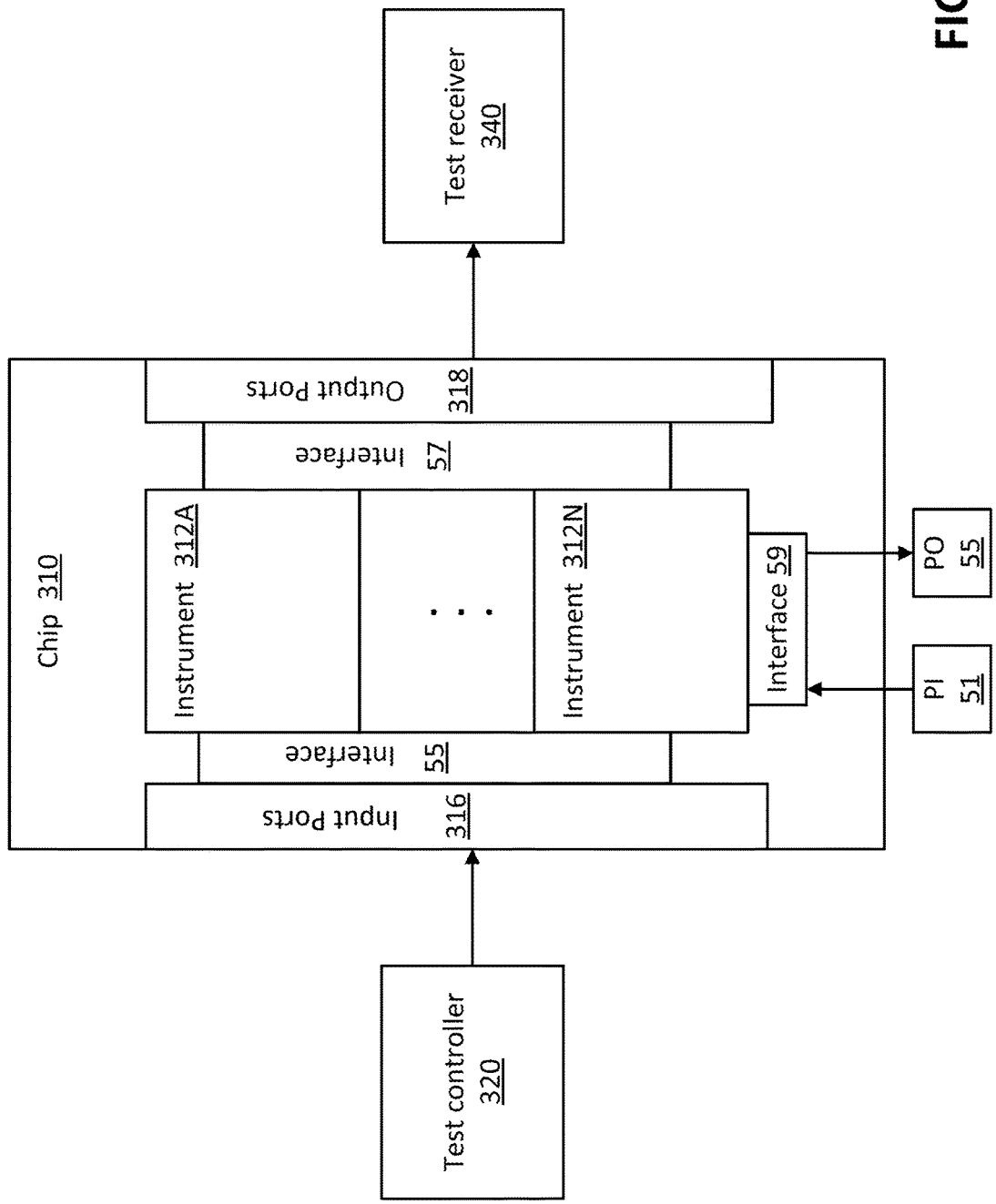
FIG. 3 is a block diagram of a simulation environment.

FIG. 3 shows a simulation environment 300 according to an embodiment of the present invention. The environment 300 includes a chip 310, a test controller 320 and a test receiver 340. The controller 320 applies test signals to input ports 316 of the chip. Test results may be read from output ports 318 of the chip, into the test receiver 340. Together, the controller 320 and the receiver 340 may perform any number of tests on the chip 310, including boundary scans that test individual instruments 312A to 312N using migrated test patterns. Although shown as separate devices, the roles of controller and receiver can be combined into a single device such as a TAP controller. The ports 316 and 318 may include individual pins or contact pads to which the test signals are applied. Accordingly, the terms "port" and "pin" are used interchangeably herein although ports need not be formed as pins.

The chip 310 includes interfaces 55 and 57 that connect instruments 312A to 312N to the input ports 316 and the output ports 318, respectively. The interfaces 55, 57 may form what is sometimes referred to as an "access network". The following is a non-exhaustive list of elements of the access network that may be specified in the chip level ICL definitions: test data registers (TDR) that store test input or test output for individual instruments, scan paths that connect the TDRs to the inputs ports 316 or the output ports 318 (and thus to the controller 320 or the receiver 340), and connections between instruments and TDRs.

The chip 310 may include direct input pins 51, also known as primary input (PI) pins, and direct output pins 55, also known as primary output (PO) pins, by which test data are applied to the instruments 312 without using the test controller 320. As with I/O ports 316 and 318, the pins 51 and 55 may be connected to the instruments via an interface specified in chip level ICL definitions, e.g., interface 59. Some instruments may be connected to only the test controller and receiver, while other instruments are connected to only the direct I/O pins. Still other instruments may be connected to both the test controller/receiver and the direct I/O pins.

Figure 4:
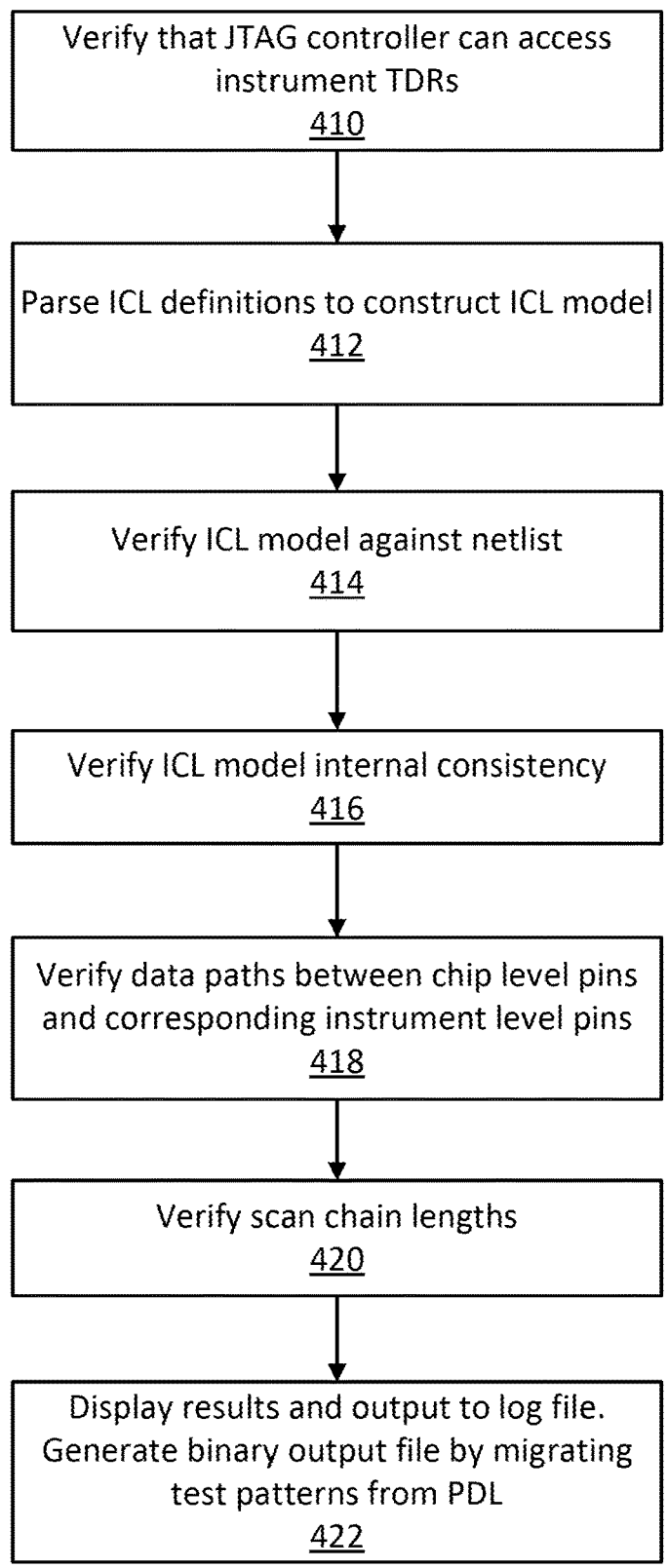
FIG. 4 is a flow chart of a method for verification during a migration process.

FIG. 4 is a flow chart of a method 400 according to an embodiment of the present invention. The method 400 includes various verification steps, which are described in further detail in connection with FIGS. 5 to 9. The method 400 may be performed using the verification system 200 of FIG. 2 and includes steps performed by a migration tool. The steps make use of data read from ICL, PDL and HDL files, which may be stored together, e.g., in a library. The method begins at step 410, where the migration tool verifies whether the test controller (e.g., a TAP controller) can successfully access the TDRs for the instruments in the chip. This step is essentially a structural test that confirms whether the test controller can load data into or read data out of the TDRs, thereby detecting structural problems that affect TDR accessibility, such as an incorrect or non-existent data path between the test controller and a particular TDR.

At step 412, the migration tool parses the ICL definitions to construct an ICL model describing the chip across the entire hierarchy. This may involve mapping I/O ports and registers from a lower level to corresponding ports and registers at a higher level. The mapping may be performed in any direction, from higher level to lower level or vice versa.

At step 414, the migration tool verifies the ICL model against a netlist for the chip. The netlist describes the interconnections between the various components of the chip. Since it is derived from HDL definitions, the netlist describes the structure of the components in much greater detail than the ICL definitions. Additionally, since the HDL definitions reflect the detailed design on the chip or its components, and are generally tested extensively prior to integration into a final chip design, the HDL definitions can be treated as a more reliable source of information on the chip's structure than the ICL definitions.

At step 416, the migration tool verifies the internal consistency of the ICL model. Inconsistencies may occur between the chip level and the instrument level because the instrument ICL definitions and the chip ICL definitions are supplied by different entities, i.e., inter-level inconsistencies. Inconsistencies may also occur within the same level, i.e., intra-level inconsistencies. For example, it is possible that the chip level ICL defines a connection to a chip level port without specifying a path to the chip level port, or specifies an incomplete path.

At step 418, the migration tool verifies whether data paths between chip level pins and corresponding instrument level pins (and pins in any intervening levels of the hierarchy) have been corrected defined. This is a structural test of the ability to access chip level pins using direct I/O pins at the chip level.

At step 420, the migration tool verifies scan chain lengths for every scan chain specified for the chip. This step detects errors attributed to incorrectly specified scan chain lengths. It also detects scenarios in which the scan chain length is correct, but the scan path is missing an element or has an erroneously included element.

At step 422, the migration tool outputs the results from the earlier verification steps to a display device and/or to a log file. The output may indicate inconsistencies between definition files, for example, by simultaneously displaying conflicting sections of code. The output may include an error message identifying an error such as "path to pin X is missing," "no path between pin X and pin Y" or "scan chain length does not match length of specified path." If all verification steps are completed without error, the migration tool may output a message stating that there were no errors detected.

The output step 422 may further include generating a binary or other machine readable output file that contains migrated test patterns. The output file may define a simulation environment, including parameters and instructions for testing instruments independently or in combination. This additional information can be derived from PDL definitions. Additionally, the migration tool may provide the user with an option to initiate a full simulation of the chip design, for example, by supplying the binary file as an input to a simulation program. If the user elects to initiate the simulation, the migration tool may output a warning if there are remaining errors, and may request user confirmation as to whether to proceed with the simulation despite the errors.

Figure 5:
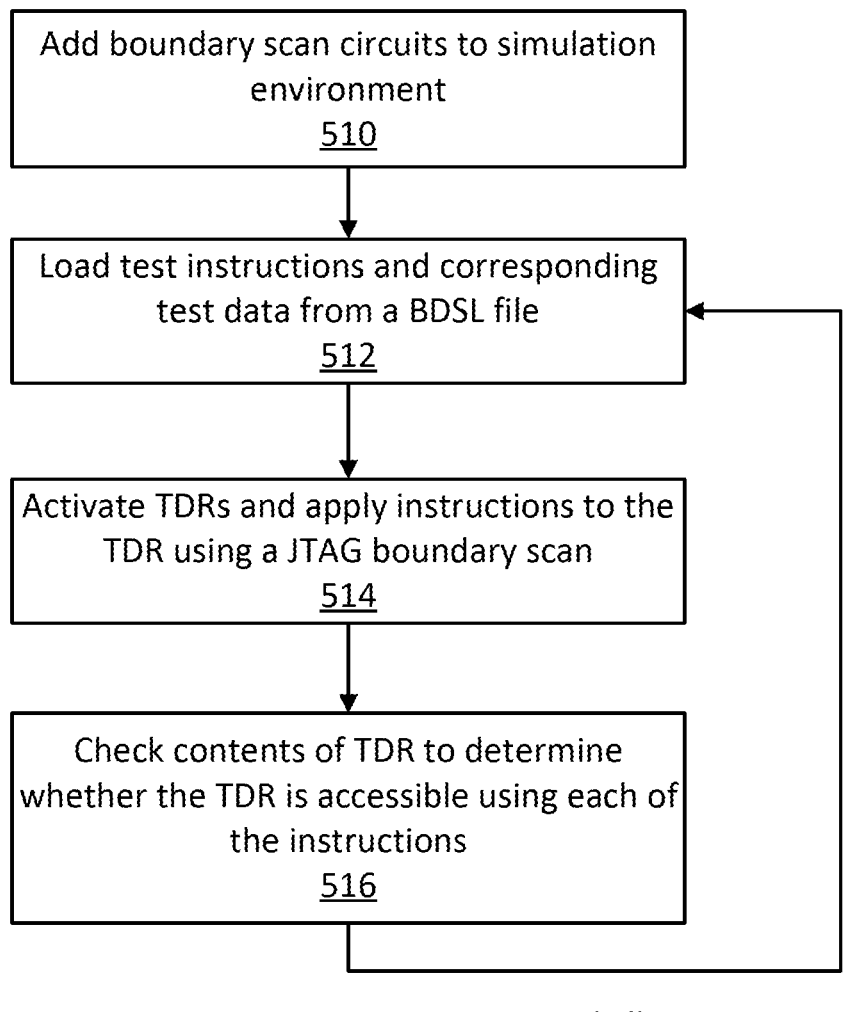
FIG. 5 is a flow chart of a method for verification of test design register accessibility.

FIG. 5 is a flow chart of a method 500 for verification of test design register accessibility. At step 510, boundary scan circuits are added to a simulation environment. These circuits include a circuit to be tested (e.g., a specific instrument), a test controller (e.g., a TAP controller) and any other components that may be needed to perform a boundary scan on the circuit to be tested (e.g., a TDR into which test instructions are loaded and a TDR storing test results).

At step 512, test instructions and corresponding test data are loaded from a BDSL file supplied, for example, by an instrument manufacturer or custom created for the instrument by the chip designer. BDSL is a hardware description language for creating a description of the boundary scan functionality within a chip, including a list of scan ports (pins used to perform a boundary scan), instruction opcodes, a device ID assigned to the instrument being tested, and boundary scan cell assignments for individual pins of the instrument being tested. Based on the BDSL file, the migration tool may configure the chip to set control pins of the instrument being tested to particular values in preparation for performing a boundary scan.

At step 514, the instrument's TDRs are activated and the boundary scan is performed by loading instructions from the BDSL file into a first TDR that operates as an instruction register, executing the instructions by applying appropriate control signals to the pins located along a boundary scan path, and storing results into a second TDR that operates as a data register.

At step 516, the contents of the second TDR are checked to determine whether the test controller was able to access both TDRs using each of the loaded instructions. If the contents of the second TDR are not as expected, this could indicate an error in an instruction (e.g., an invalid opcode was applied to the instrument) or a structural error in the scan path. The method then returns to step 512 to load boundary scan instructions for the next instrument. In this manner, boundary scans may be performed for all instruments in the chip to determine the ability of the test controller to access their assigned TDRs.

Figure 6:
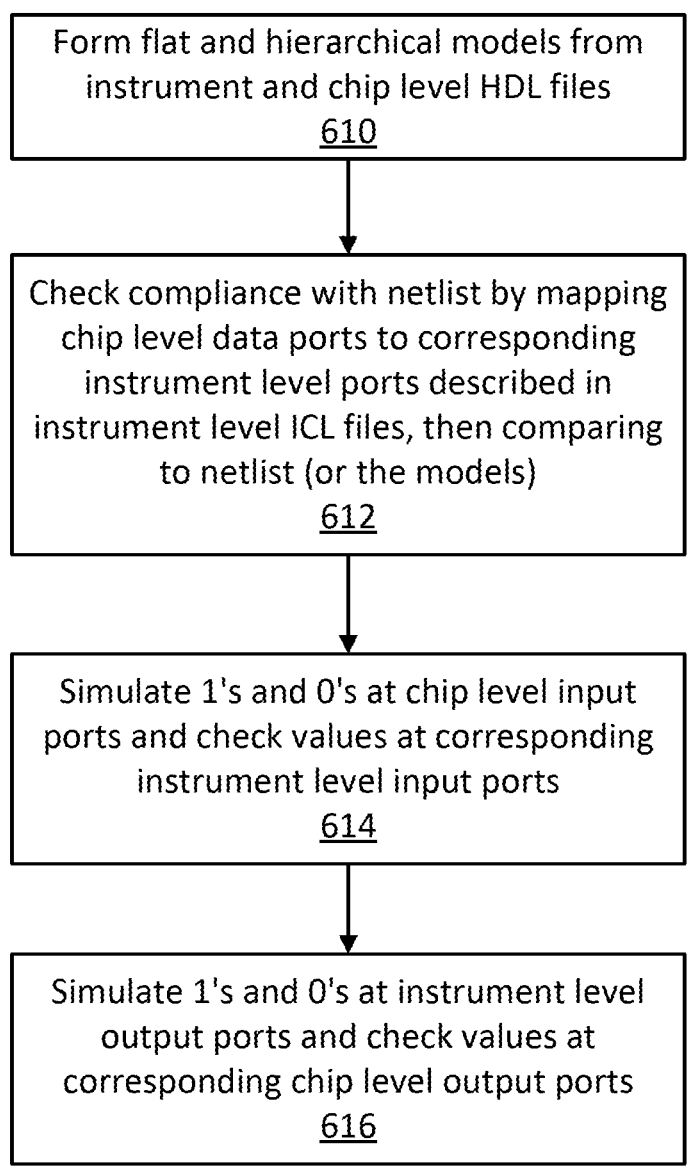
FIG. 6 is a flow chart of a method for verification of data paths.

FIG. 6 is a flow chart of a method 600 for verification of data paths. The method begins at step 610 by forming an internal flat model and a hierarchical model describing the chip's structure. The models are formed using HDL definitions throughout the chip hierarchy, including definitions contained in instrument and chip level HDL files. The models are created by the migration tool from the netlist to efficiently store and process the data in the netlist for internal use. The models therefore store the relevant information of the netlist. Both flat and hierarchical models are built as they provide different viewing and access methods to process information from the netlist efficiently.

At step 612, the instrument level ICL files are checked for compliance with the netlist by mapping chip level data ports to corresponding instrument level ports described in instrument level ICL files, then comparing the ICL based mapping to a mapping provided by the netlist. If the comparison is successful, the method proceeds to step 614. Otherwise, the method may terminate with a display or storage of an appropriate error message.

At step 614, logical values of 1's and 0's are simulated at each chip level input port (e.g., a PI pin), thereby sensitizing the data paths to which the input ports are connected. The resulting values at corresponding instrument level input ports are then measured and compared to expected values. Correspondences between instrument and chip level ports are provided by the earlier mapping in step 612. In this manner, the method checks the integrity of the data path between the chip level input ports and the instrument level input ports.

At step 616, logical values of 1's and 0's are simulated at each instrument level output port, measuring resulting values at corresponding chip level output ports (e.g., a PO pin), and comparing the measured values to expected values. This step checks the integrity of the data path between the instrument level output ports and the chip level output ports. The entire data path from a chip level input port to a corresponding chip level output port can thus be checked using step 614 in combination with step 616. As with any of the verification algorithms described herein, appropriate messages describing the results of the verification can be displayed and/or logged.

Figure 7:
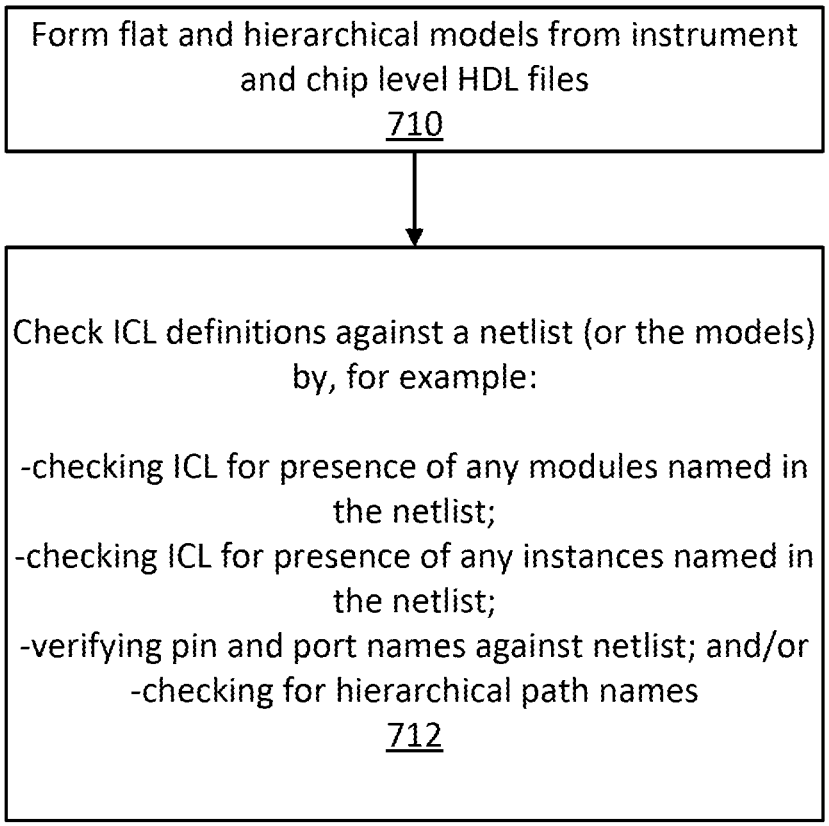
FIG. 7 is a flow chart of a method for verification of ICL definitions.

FIG. 7 is a flow chart of a method 700 for verification of ICL definitions. At step 710, the flat model and the hierarchical model are formed using HDL definitions throughout the chip hierarchy, including definitions contained in instrument level and chip level HDL files. The models may already exist, for example if the method of FIG. 6 was performed earlier, and therefore need not be formed again unless the HDL files have been modified since the models were last formed.

At step 712, the ICL definitions are checked against the netlist. This may involve multiple checks for various inconsistencies that might arise between an ICL definition and the netlist. Examples of such checks include: checking ICL files to confirm the presence of any modules named in the netlist, checking ICL files to confirm the presence of any instances named in the netlist, matching pin and port names in the ICL files against pin and port names in the netlist, and checking for matching hierarchical path names. Note that instead of checking directly against the netlist, it may be preferable to check against the flat and hierarchical models. Therefore, in any of the above-noted checks that relate to verifying compliance with the netlist (e.g., step 612 in FIG. 6 and step 712 in FIG. 7), the models may be used as a representation of the netlist or HDL files.

Figure 8:
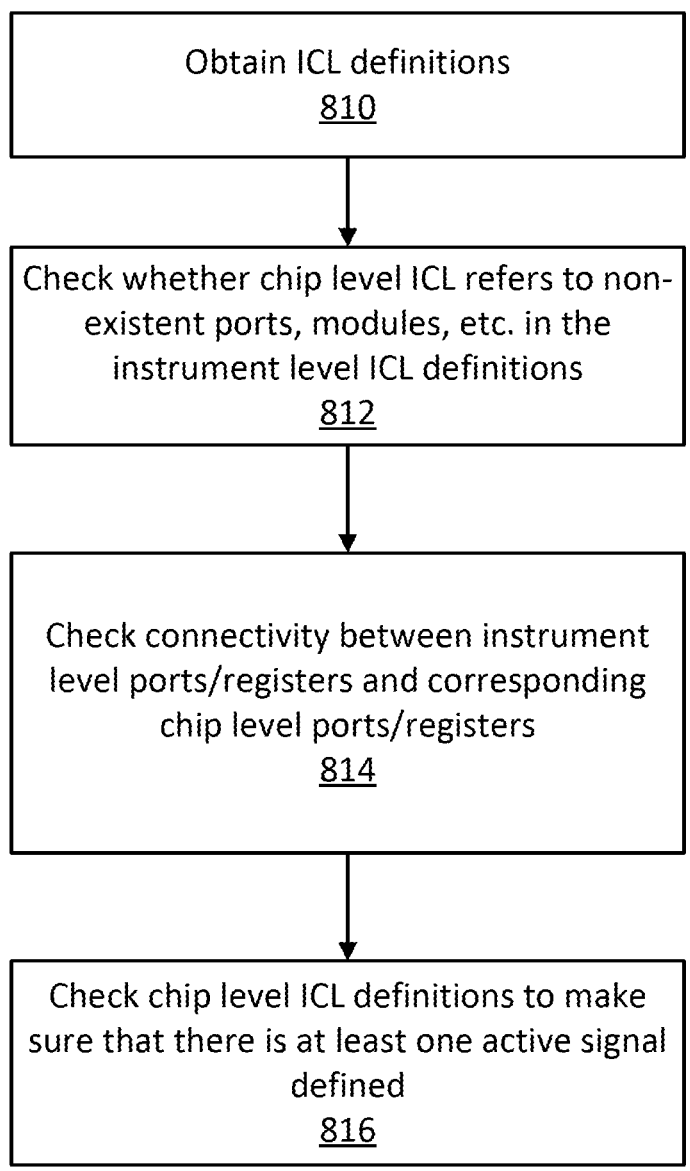
FIG. 8 is a flow chart of a method for verification of ICL internal consistency.

FIG. 8 is a flow chart of a method 800 for verification of ICL internal consistency. The method begins at step 810 by obtaining ICL definitions throughout the chip hierarchy.

At step 812, the chip level ICL definitions are checked to determine whether the chip level ICL refers to pins, modules, and other components that are non-existent in the instrument level ICL definitions.

At step 814, the connectivity between instrument level ports and registers and corresponding chip level ports and registers is checked by comparing chip and instrument level ICL definitions to confirm that there are no errors in the paths that connect the ports/registers from one level to the ports/registers of another level.

At step 816, the chip level ICL is checked to confirm whether the ICL defines at least one active signal. An active signal is a signal that is activated when a particular JTAG instruction is loaded. This defines which instruments will be active when that particular instruction is loaded and thus defines the flow of data. If no active signal is defined, that means no path is being activated; thus at least one active signal should be defined.

Figure 9:
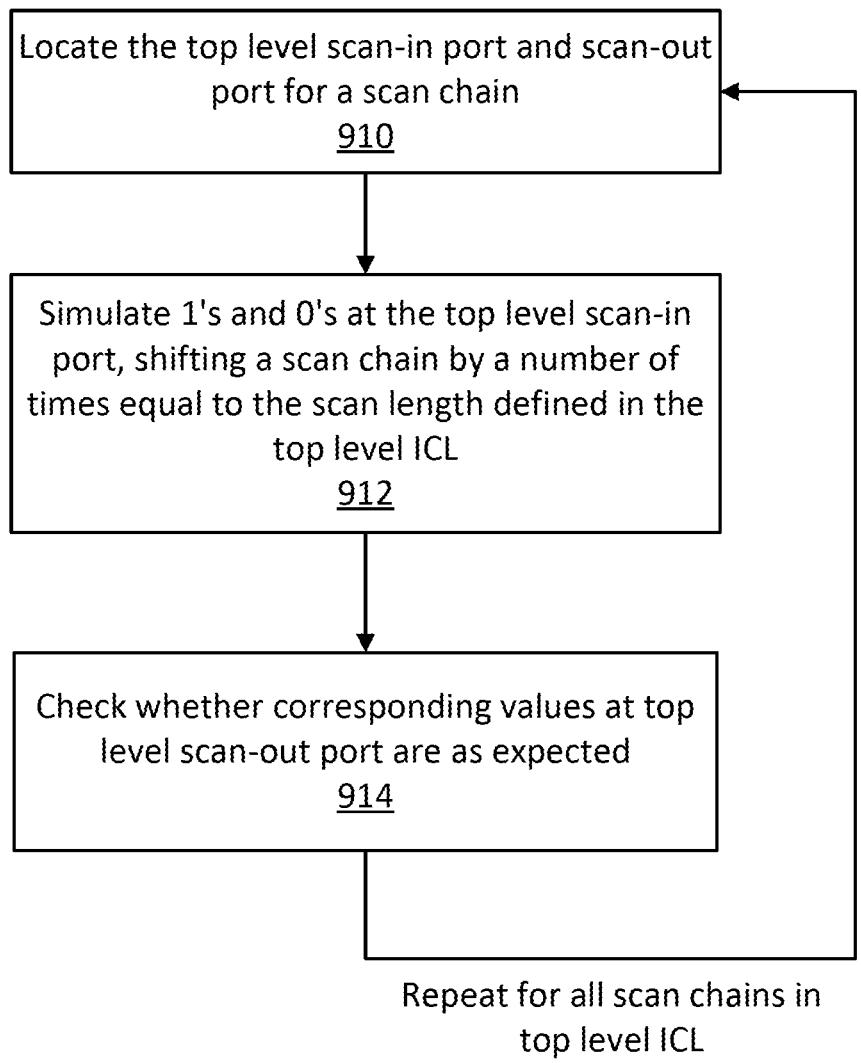
FIG. 9 is a flow chart of a method for verification of scan chain lengths.

FIG. 9 is a flow chart of a method 900 for verification of scan chain lengths. At step 910, the top level scan-in and scan-out ports for a particular scan chain under consideration are located by searching the chip level ICL definitions.

At step 912, 1's and 0's are simulated at the top level scan-in port, shifting the scan chain to which the scan-in port is connected by a number of times equal to the scan length specified in the chip level ICL. The scan length may be specified in ICL (e.g., using the length of the scan registers) as well as in the netlist. Therefore, this step can check the consistency of ICL with the netlist in regard to the specified scan length.

At step 914, the resulting values produced at the top level scan-out port are measured and compared to expected values. If the actual scan length is the same as the specified scan length, then the values should match. If the values mismatch, this could indicate an incorrectly specified scan chain length or a structural problem with the scan path, e.g., the scan path is missing an element or has an erroneously included element. This step is useful because the user can erroneously define different lengths for the same scan registers in ICL and the netlist, which could later create a simulation miscompare. The method then returns to step 910 to repeat the scan length verification for all scan chains in the top level.

The description of the foregoing embodiments may refer to algorithms, sequences, macros, and operations that require processor execution of instructions stored in memory. The processor may be specific to an apparatus, such as automated test equipment (ATE). The processor executes, or selectively activates in order to execute, a computer program. The computer program is stored in memory associated with the apparatus. Memory available on the apparatus may include a computer readable storage medium, which is not limited to, but may include, any type of disk, including floppy disks, optical disks, CD-ROMs, magnetic-optical disks, and other memory such as read-only memory (ROMs), random access memory (RAMs), electrically erasable programmable read-only memory (EE-PROM), flash memory, other storage devices such as magnetic or optical cards, or any type of media capable of storing program instructions. Each of the memory devices in the apparatus may be further connected to or coupled to a system bus or a network connection, wired or unwired, capable of facilitating or driving communications.

In the foregoing description, various features may be grouped together in a single embodiment for purposes of streamlining the disclosure. This method of disclosure is not to be interpreted as reflecting an intention that the claims require more features than are expressly recited in each claim. Rather, as the following claims reflect, inventive aspects lie in less than all features of a single foregoing disclosed embodiment. Thus, the following claims are hereby incorporated into this description, with each claim standing on its own as a separate embodiment of the invention.

Moreover, it will be apparent to those skilled in the art from consideration of the specification and practice of the present disclosure that various modifications and variations can be made to the disclosed systems and methods without departing from the scope of the disclosure, as claimed. Thus, it is intended that the specification and examples be considered as exemplary only, with a true scope of the present disclosure being indicated by the following claims and their equivalents.

What is claimed is:

1. A method for verifying a correctness of data formatted according to an IEEE P1687 (IJTAG) standard, in connection with a migration of test patterns from an instrument level to a top level of an integrated circuit design, the method comprising:

reading, by a computer processor, data describing an integrated circuit at the instrument level and at the top level, wherein the data is read from Instrument Connectivity Language (ICL) files, Procedural Description Language (PDL) files, and hardware description language (HDL) files; and performing a verification procedure by the processor and using the read data, wherein the verification procedure includes at least one of verifying structural descriptions of the integrated circuit in the ICL files or verifying an ability to use chip level inputs to access instruments in the integrated circuit, wherein the verification procedure includes checking the ICL files for inter-level and intra-level inconsistencies, and wherein the verification procedure is performed prior to a simulation in which a migrated test pattern is applied to the integrated circuit.

2. The method of claim 1, wherein the verification procedure includes checking ICL descriptions against at least one model formed from the HDL files, and wherein each model describes a structure of the integrated circuit at each level.

3. The method of claim 1, wherein the checking of the ICL files includes checking for references in the top level to non-existing components in the instrument level.

4. The method of claim 1, wherein the checking of the ICL files includes checking whether a top level ICL file defines at least one active signal.

5. The method of claim 1, wherein the verification procedure includes:
mapping top level input ports to corresponding instrument level input ports based on the ICL files;
simulating logical 1's and 0's at the top level input ports; and
checking resulting values produced at the instrument level input ports against expected values.

6. The method of claim 1, wherein the verification procedure includes:
mapping top level output ports to corresponding instrument level output ports based on the ICL files;
simulating logical 1's and 0's at the instrument level output ports; and
checking resulting values produced at the top level output ports against expected values.

7. The method of claim 1, wherein the verification procedure includes performing a boundary scan to determine whether a test data register assigned to a particular instrument can be accessed.

8. The method of claim 7, wherein the boundary scan executes instructions contained in a boundary scan description language (BDSL) file for the particular instrument.

9. The method of claim 1, wherein the verification procedure includes verifying a scan chain length by:
simulating logical 1's and 0's at a top level scan-in port;
shifting a scan chain to which the top level scan-in port is connected by a number of times equal to a specified scan chain length; and
checking whether resulting values at a top level scan-out port are as expected.

10. A system for verifying a correctness of data formatted according to an IEEE P1687 (IJTAG) standard, in connection with a migration of test patterns from an instrument level to a top level of an integrated circuit design, the system comprising:
a computer readable library storing data describing an integrated circuit at the instrument level and at the top level, wherein the data is stored in Instrument Connectivity Language (ICL) files, Procedural Description Language (PDL) files, and hardware description language (HDL) files;
a computer processor that reads the stored data; and
a software implemented migration tool containing a verification module that causes the computer processor to perform a verification procedure using the read data, wherein the verification procedure includes at least one of verifying structural descriptions of the integrated circuit in the ICL files or verifying an ability to use chip level inputs to access instruments in the integrated circuit, wherein the verification procedure includes checking the ICL files for inter-level and infra-level inconsistencies, and wherein the verification procedure is performed prior to a simulation in which a migrated test pattern is applied to the integrated circuit.

11. The system of claim 10, wherein the verification procedure includes checking ICL descriptions against at least one model formed from the HDL files, and wherein each model describes a structure of the integrated circuit at each level.

12. The system of claim 10, wherein the checking of the ICL files includes checking for references in the top level to non-existing components in the instrument level.

13. The system of claim 10, wherein the checking of the ICL files includes checking whether a top level ICL file defines at least one active signal.

14. The system of claim 10, wherein the verification procedure includes:
mapping top level input ports to corresponding instrument level input ports based on the ICL files;
simulating logical 1's and 03 s at the top level input ports; and
checking resulting values produced at the instrument level input ports against expected values.

15. The system of claim 10, wherein the verification procedure includes:
mapping top level output ports to corresponding instrument level output ports based on the ICL files;
simulating logical 1's and 03 s at the instrument level output ports; and
checking resulting values produced at the top level output ports against expected values.

16. The system of claim 10, wherein the verification procedure includes performing a boundary scan to determine whether a test data register assigned to a particular instrument can be accessed.

17. The system of claim 16, wherein the boundary scan executes instructions contained in a boundary scan description language (BDSL) file for the particular instrument.

18. The system of claim 10, wherein the verification procedure includes verifying a scan chain length by:
simulating logical 1's and 0's at a top level scan-in port;
shifting a scan chain to which the top level scan-in port is connected by a number of times equal to a specified scan chain length; and
checking whether resulting values at a top level scan-out port are as expected.

19. The system of claim 10, wherein the verification procedure further includes verifying data paths between chip level pins and corresponding instrument level pins.

20. A method for verifying a correctness of data formatted according to an IEEE P1687 (IJTAG) standard, in connection with a migration of test patterns from an instrument level to a top level of an integrated circuit design, the method comprising:
reading, by a computer processor, data describing an integrated circuit at the instrument level and at the top level, wherein the data is read from Instrument Connectivity Language (ICL) files, Procedural Description Language (PDL) files, and hardware description language (HDL) files; and
performing a verification procedure by the processor and using the read data, wherein the verification procedure includes at least one of verifying structural descriptions of the integrated circuit in the ICL files or verifying an ability to use chip level inputs to access instruments in the integrated circuit, wherein the verification procedure further includes verifying data paths between chip level pins and corresponding instrument level pins, and wherein the verification procedure is performed prior to a simulation in which a migrated test pattern is applied to the integrated circuit.

* * * * *